(12) United States Patent
Kim (10) Patent No.: US 8,009,274 B2
(45) Date of Patent: Aug. 30, 2011

(54) IN-DIE FOCUS MONITORING WITH BINARY MASK

(75) Inventor: Ryoung-han Kim, Guilderland, NY (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 548 days.

(21) Appl. No.: 12/167,808

(22) Filed: Jul. 3, 2008

(65) Prior Publication Data

US 2010/0002214 A1    Jan. 7, 2010

(51) Int. Cl.
  *G03B 27/52* (2006.01)
  *G03B 27/68* (2006.01)
(52) U.S. Cl. ............................. 355/55; 355/52
(58) Field of Classification Search .............. 355/52, 355/53, 55, 67, 77; 430/5, 20, 30, 311; 356/399–401
See application file for complete search history.

(56) References Cited

U.S. PATENT DOCUMENTS

| | | | |
|---|---|---|---|
| 5,418,092 A * | 5/1995 | Okamoto | ................ 430/5 |
| 5,936,738 A | 8/1999 | Liebmann et al. | |
| 6,251,564 B1 * | 6/2001 | Lin et al. | .............. 430/311 |
| 7,396,621 B2 * | 7/2008 | Fujisawa et al. | ............... 430/30 |
| 2002/0195539 A1 | 12/2002 | Nakao et al. | |
| 2009/0092926 A1 * | 4/2009 | Gutmann et al. | ........... 430/312 |

OTHER PUBLICATIONS

Zhang, G. et al., Across Wafer Focus Mapping and Its Application in Advanced Technology Nodes, Optical Proceedings of SPIE, the International Society for Optical Engineering, Feb. 21-24, 2006, 10 pages, vol. 6154, Society of Photo-Optical Instrumentation Engineers, Bellingham, WA USA.

Brunner, T.A. et al, Simulations and Experiments with the Phase Shift Focus Monitor, Proceedings of SPIE, the International Society for Optical Engineering, 1996, pp. 236-243, vol. 2726, Society of Photo-Optical Instrumentation Engineers, Bellingham, WA USA.

Nakao, S. et al., Implementation of phase-shift focus monitor with modified illumination, Proceedings of SPIE, the International Society for Optical Engineering, Mar. 5, 2002, pp. 918-926, vol. 4691.

* cited by examiner

*Primary Examiner* — Hung Henry Nguyen
(74) *Attorney, Agent, or Firm* — Ditthavong Mori & Steiner, P.C.

(57) ABSTRACT

Focus monitoring for a photolithographic applications is provided by illuminating a photoresist layer with a light beam transmitted through a first binary mask to define a circuit pattern on an underlying substrate and then illuminating the photoresist layer with an unbalanced off-axis light beam transmitted through a second binary mask. The second mask contains a shifting feature configuration in one portion, while another portion blocks light transmission to the chip design area of the photoresist. After development of the photoresist layer, the pattern formed by illumination of the second mask can be compared with a predefined reference feature on the photoresist layer to determine whether a shift, if any, is within acceptable focus limits.

21 Claims, 9 Drawing Sheets

Annular illumination

C-quad illumination

Dipole illumination

Quadrupole illumination

IN-DIE FOCUS MONITORING WITH BINARY MASK

BACKGROUND

The present disclosure relates to fabrication of semiconductor devices having accurately formed designed features, more particularly to monitoring focus for die patterns formed during the fabrication process.

The formation of various integrated circuit (IC) structures on a wafer often relies on lithographic processes, sometimes referred to as photolithography, or simply lithography. As is well known, lithographic processes can be used to transfer a pattern of a photomask (also referred to herein as a mask or a reticle) to a wafer. Patterns can be formed from a photoresist layer disposed on the wafer by passing light energy through a reticle mask to form an image of the desired pattern onto the photoresist layer. As a result, the pattern is transferred to the photoresist layer. Such pattern formations are performed by devices well known as optical steppers or scanners. Conventional photomasks, commonly referred to as chrome on glass (COG), consist of chromium patterns on a quartz plate. Light of a specific wavelength is projected through the spaces between the chromium patterns onto the wafer. As the chromium portions block light transmission, such photomasks are known as binary masks.

In areas where a positive type photoresist is sufficiently exposed, after a development cycle the photoresist material can become soluble such that it can be removed to selectively expose an underlying layer (e.g., a semiconductor layer, a metal or metal containing layer, a dielectric layer, a hard mask layer, etc.). Portions of the photoresist layer not exposed to a threshold amount of light energy will not be removed and will serve to protect the underlying layer during further processing of the wafer (e.g., etching exposed portions of the underlying layer, implanting ions into the wafer, etc.). If a negative type photoresist is used, unexposed portions are selectively removed. After the wafer fabrication process for this pattern is performed, the remaining portions of the photoresist layer can be removed from the underlying substrate.

There is a continuing objective to increase the density with which various integrated circuit structures are arranged. To this end, feature size, line width, and the separation between features and lines are being made smaller. Fabrication in the sub-micron range incurs limitations on the faithful reproduction of reticle patterns as exposed images on the photoresist layer. Yield is affected by factors such as mask pattern fidelity, optical proximity effects, photoresist processing and tool precision. These concerns are largely dependent on local pattern density and topology. In describing the lithographic yield, exposure latitude and depth of focus are two critical elements that describe allowable margin of exposure light dose and defocus amount that can print the circuitry without generating a failure in functionality of the chip. As the required pitch continues to be reduced, the depth of focus of the projected light has significantly decreased.

In current photo-lithography technology, application of off-axis illumination of shorter wavelength has become necessary to provide appropriate process margin for minimum pitch. In order to obtain maximum process window, it is thus imperative to determine the best focus plane so that the position of the photoresist can be adjusted to a critical dimension to place the focus within the process margin. One known approach is by exposing a matrix field through a range of focus settings, then inspecting the resultant pattern for the best-focused images. This procedure is time consuming and subject to error.

Another approach employs a phase shift mask that includes a transparent substrate, a light-shielding film having a predetermined pattern, and a phase shifter formed on the predetermined pattern. As a result of the phase shifter, an image pattern is formed on the photoresist that shifts along its surface plane as the substrate wafer is moved in the direction of the illumination axis. Measurement of the amount of shift of the pattern image in a direction along the surface enables correlation with a position in the axis direction, thereby providing a measurement of focus. The phase shift mask is a complex structure which presents greater difficulty in forming patterns on both sides of the mask than formation of a binary mask.

Other phase shift mask focus monitoring methods employ a plurality of phase shift masks, each requiring a separate exposure at a special aperture stop. The photoresist additionally must be exposed at the aperture used for chip fabrication.

Phase shift monitoring thus adds a significant manufacturing cost as well as lengthening the entire process. A need thus exists for a monitoring method and system that can provide accurate focus detection, more simply and efficiently, and at less manufacturing cost, than systems currently available.

DISCLOSURE

The above described needs are fulfilled, at least in part, by illuminating a photoresist layer with a light beam transmitted through a first mask to define a circuit pattern on an underlying substrate and then illuminating the photoresist layer with an unbalanced off-axis light beam transmitted through a second mask. Both masks are binary masks. The second mask contains a shifting feature configuration in one portion, while another portion blocks light transmission to the chip design area of the photoresist. After development of the photoresist layer, the pattern formed by illumination of the second mask can be compared with a predefined reference feature on the photoresist layer to determine whether a shift, if any, is within acceptable focus limits.

The light beam transmitted through the first mask may be generated by any of various balanced off-axis light sources including, but not limited to, annular illumination, dipole illumination, C-quad illumination, quadrupole illumination and quasar illumination. The light beam transmitted through the second mask may be generated by a monopole illumination source. The shifting feature configuration of the second mask is based on focus monitoring information that relates a lateral shift with a change in focal distance in the axis direction. The shifting feature is positioned on the second such that it will be reproduced, when exposed to the unbalanced light beam, on the photoresist in proper alignment with the reference feature if the photoresist surface is at the focus plane.

The predefined reference feature may be applied to the photoresist during the first mask exposure. The reference feature may be an actual feature of chip design or a separate reference mark. By maintaining the same center sigma value for the first balanced off-axis light exposure and the second unbalanced off-axis light exposure, a relationship between shift and focus can be established. The predefined reference feature, instead, may be applied to the photoresist during the second mask exposure. In the latter case, the reference feature is dimensioned as a sufficiently narrow isolated feature such that the spectrum fills the pupil almost evenly, whereby the shift in spectrum causes minimal pattern shift. The isolated feature on the second mask is narrow enough to preclude shifting of this feature when exposed by an unbalanced off-axis illumination source of high intensity. The shifting feature is dimensioned to cause a shift. The shifting feature is positioned on the second mask so that its resulting image shift on the photoresist will correspond favorably with the reference feature for appropriate focus. Focus monitoring accuracy is preserved by maintaining the same center sigma value for the first balanced off-axis light exposure and the second unbalanced off-axis light exposure.

The predetermined reference feature and the reference shifting feature may, for example, comprise bar configurations or box configurations. With bar configurations, focus determination may be made on the basis of the relative alignment between the reference feature and the shifted feature. With box configurations, the outer reference feature box configuration surrounds the inner shifted box configuration. Only the shifting box is shifted during second mask exposure. In focus condition, the center of the inner, phase shifted box should be coincident with the center of the reference box. In a defocus condition, the shifted box is moved laterally with respect to the reference box. The defocus amount can be quantized by measuring the distance between an edge of the inner box and outer box and comparing this value with the distance between these edges for the in focus condition.

Additional advantages of the present disclosure will become readily apparent to those skilled in this art from the following detailed description, wherein only preferred embodiments of the invention are shown and described, simply by way of illustration of the best mode contemplated of carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

The present invention is illustrated by way of example, and not by way of limitation, in the figures of the accompanying drawing and in which like reference numerals refer to similar elements and in which.

DETAILED DESCRIPTION

Figure 1:
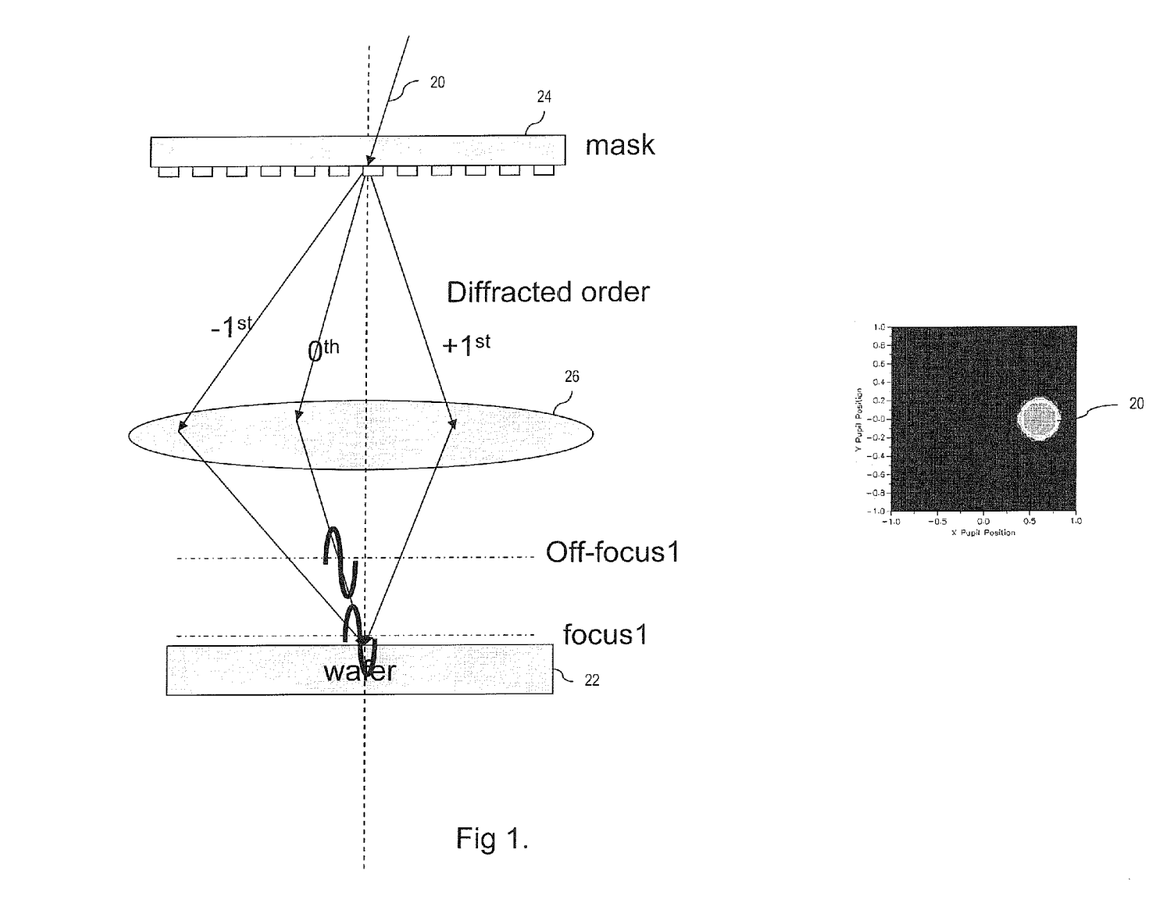
FIG. 1 is a schematic representation of wafer exposure using monopole off-axis illumination.

As shown in FIG. 1, light beam 20 is applied to wafer 22 through mask 24 and focus lens 26. Although not shown, the surface of the wafer is covered with a photoresist layer upon which a pattern for one or more chip circuit designs formed in mask 24 is to be transferred. Light transmitted through the mask is diffracted and then focused by lens 26 at a first order focus plane proximate the wafer surface. An off-focus plane is shown spaced vertically from the wafer surface. Light beam 20 is generated by a monopole source or a part of the balanced source and is directed to the mask at an inclined angle from the optical axis of illumination of the wafer. The pupil position of the source of beam 20 in a plane orthogonal to the axis is represented in the drawing figure. If the wafer 22 is moved in the direction of the optical axis to the off-focus plane, the image pattern shifts in a lateral direction (the x-y direction) at the surface of wafer 22. This shift is produced as a consequence of the unbalanced off-axis application of light beam 20.

Figure 2:
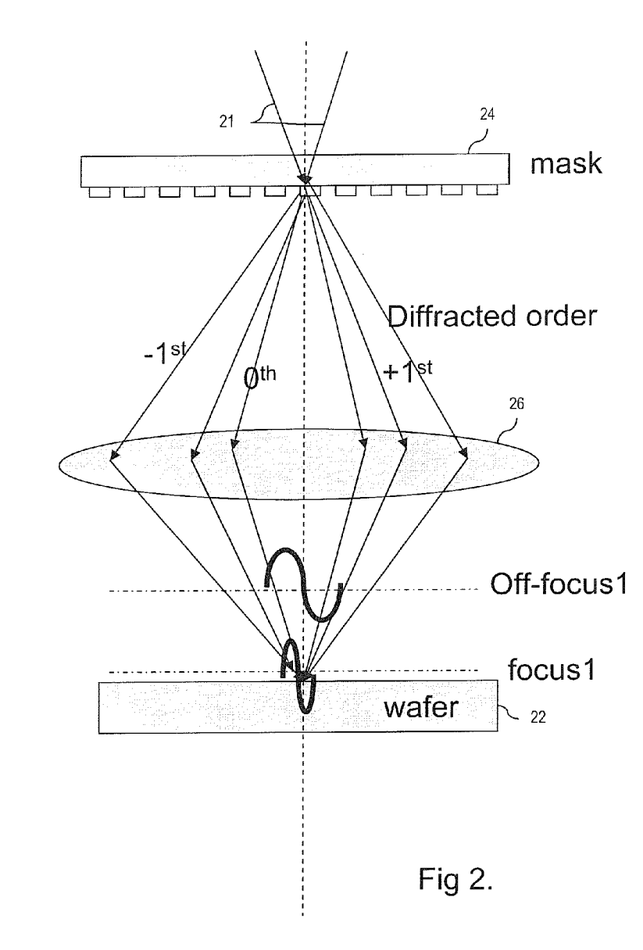
FIG. 2 is a schematic representation of wafer exposure using balanced pole off-axis illumination.

A balanced off-axis light beam 21 is applied to wafer 22 through mask 24 and focus lens 26 in the illustration of FIG. 2. A dipole source is exemplified, as illustrated. As the radiation is balanced with respect to the optical axis, there is no shift of the image pattern, although it will be defocused, in the off-focus plane. The focus monitoring technique, to be more fully described hereinafter, provides an indication of focus, or degree of defocus, of the photoresist surface from exposure to a balanced off-axis source, by additionally applying exposure of the photoresist to an unbalanced off-axis source that produces a defined image shift.

Figure 3:
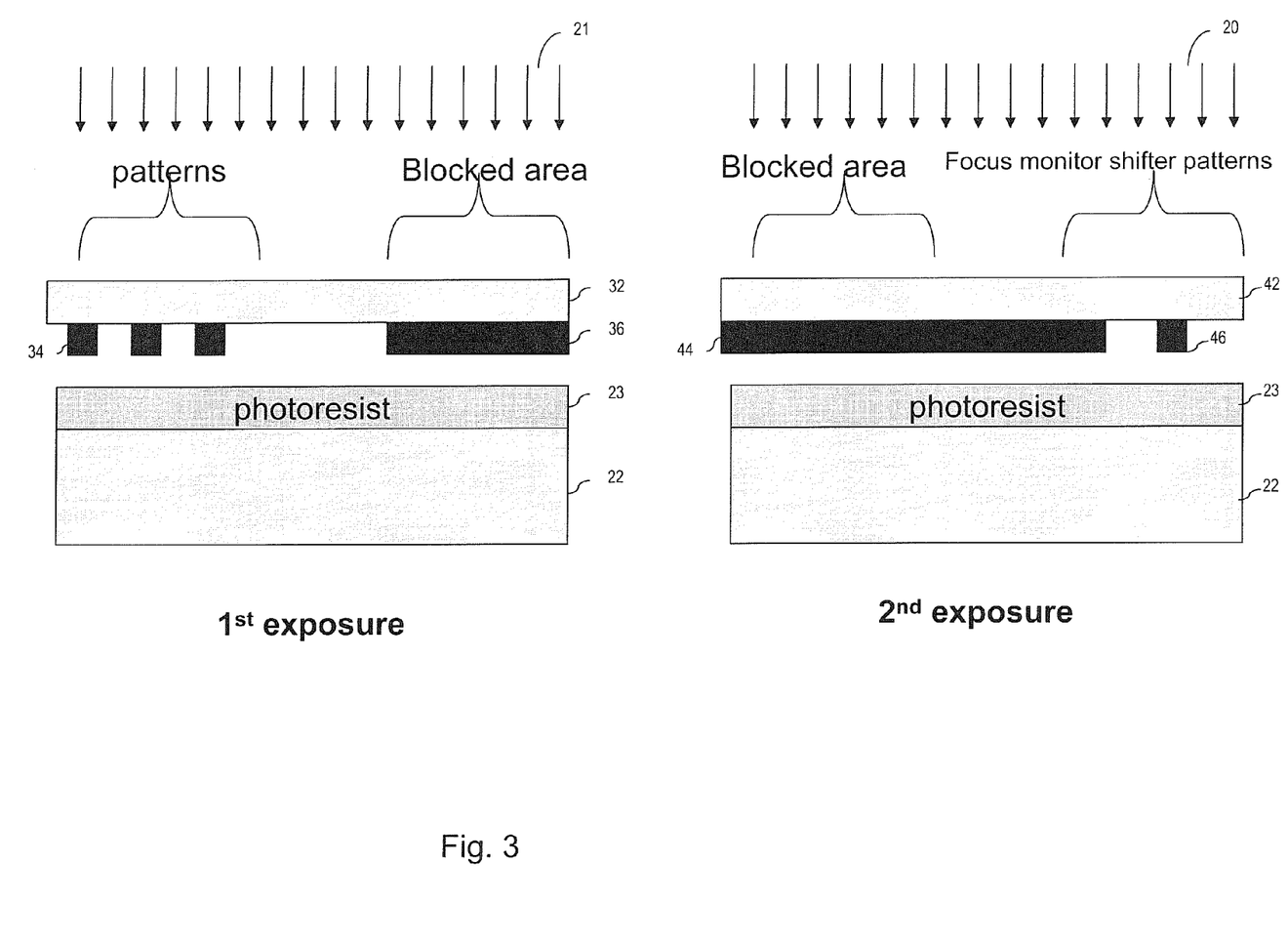
FIG. 3, shown in cross-section, is a simplified illustration in which image patterns are formed on a photoresist by separate mask exposures.
Figure 4:
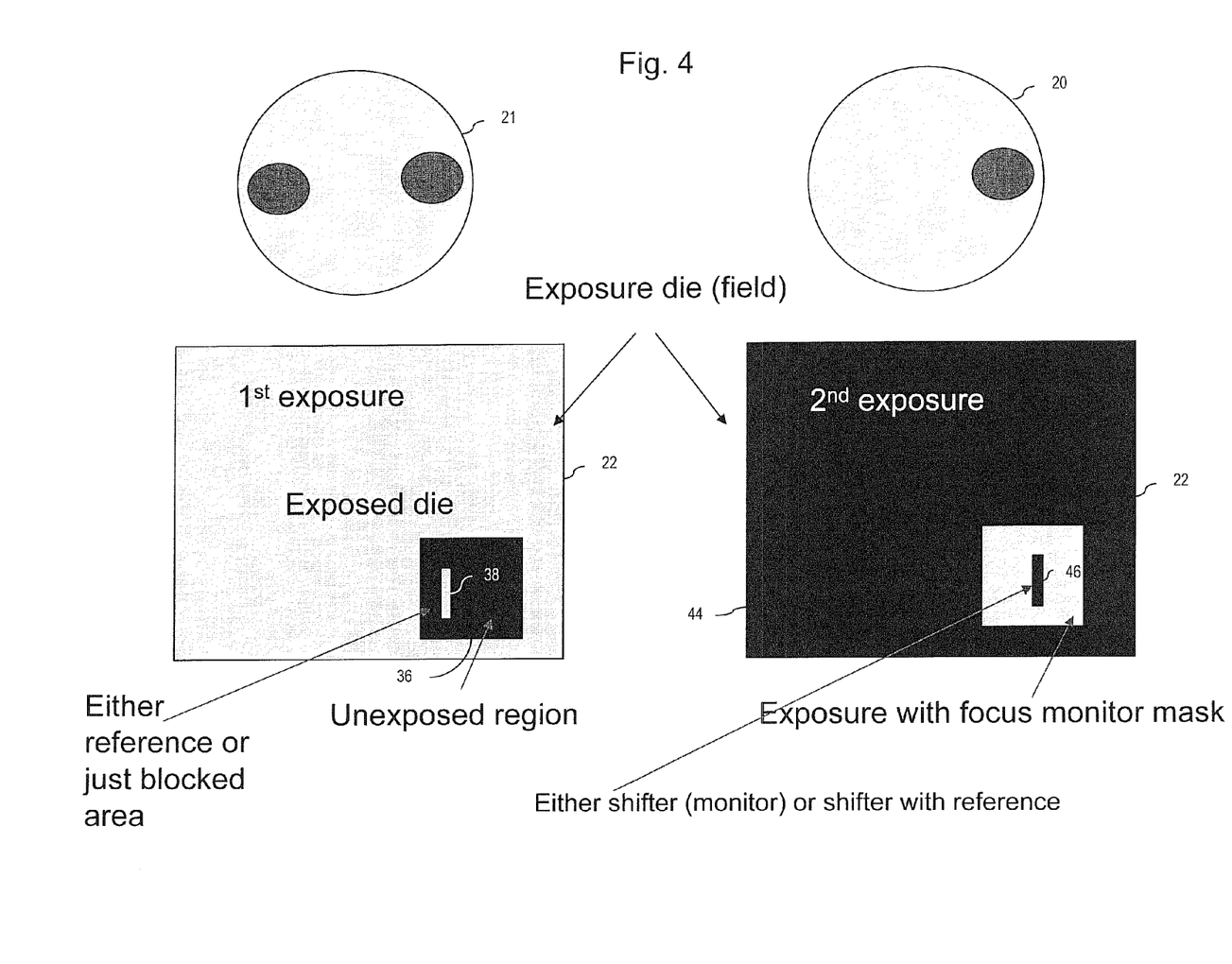
FIG. 4 is an illustration of an application of in-die focus monitoring using double imaging with a binary mask, such as shown in FIG. 3.
Figure 5:
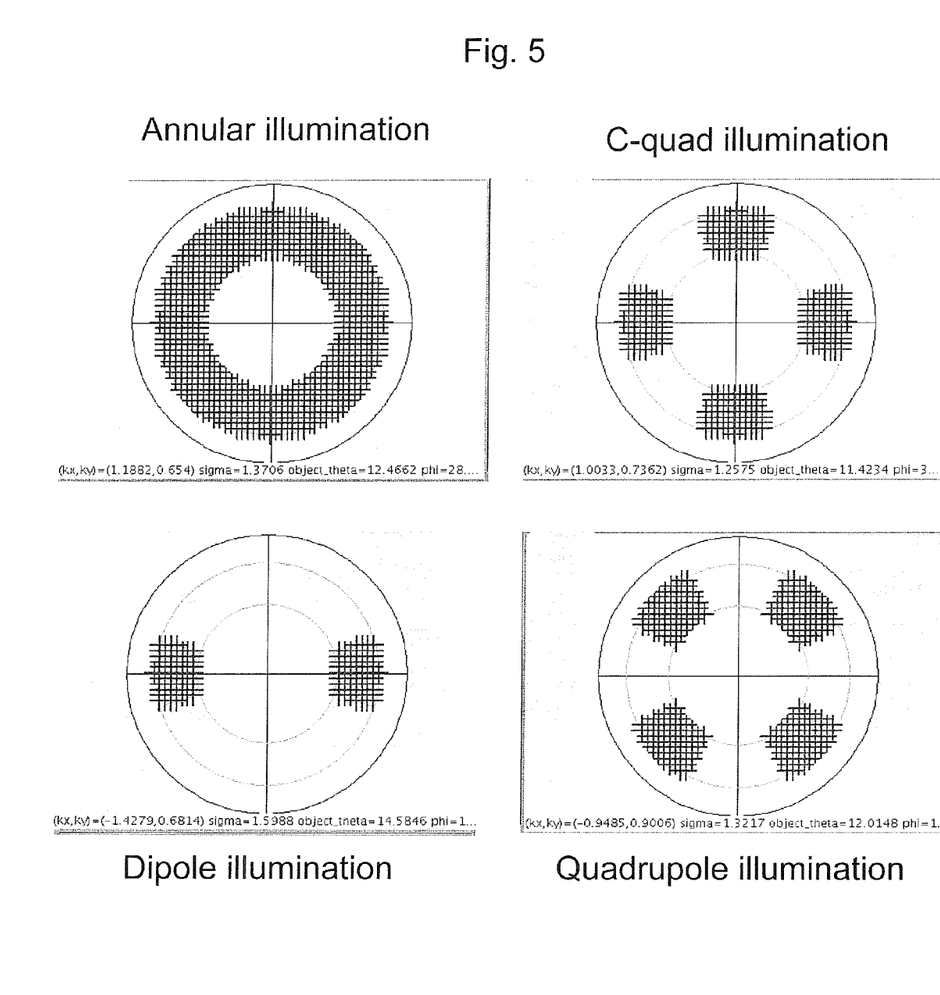
FIG. 5 is an illustration of several types of balanced off-axis illumination sources.

Application of the two exposures for in-die focus monitoring is illustrated in FIGS. 3 and 4. Balance light source 21, exemplified by a dipole source in FIG. 4, generates illumination that is directed through mask 32. Although light source 21 has been exemplified as a dipole source, any balanced off-axis source that is suitable for forming circuit design patterns may be used. FIG. 5 illustrates some appropriate alternatives, including annular illumination, C-quad illumination, and quadrupole illumination sources.

Mask 32 is a binary mask such as, for example, a chrome on glass (COG) construction. Chrome acts to block transmission of light. It should be appreciated that equivalent light blocking materials may be used as an alternative to chrome. As shown in cross-section in FIG. 3, the mask 32 comprises a first portion in which circuit patterns are formed by appropriate layout and dimensions of the chrome material on the glass. Mask 32 permits transmission of light beam 21 through those areas of the mask in which no chrome patterns are formed. The transmitted light is applied through a lens, such as illustrated in FIG. 2, for exposure on photoresist 23. Mask 32 comprises a second portion 36 that blocks light transmission.

Thus, the first exposure applies the balanced light that transfers the circuit design pattern to the photoresist. The pattern will be in focus if the surface of the photoresist is at a distance from the mask that is within an acceptable margin of the focus plane. Focus monitoring is implemented with the second exposure. For the second exposure, mask 32 is replaced by binary mask 42. Monopole source 20 generates illumination that is directed through mask 42. A first portion of mask 42 is a blocked area that prevents transmission of light to the circuit patterned area formed on the photoresist 23 during the first exposure. A second portion of mask 42 contains focus monitor pattern(s), exemplified by a light blocking feature 46. As the light beam 20 is unbalanced, the image of feature 46 will be shifted on the photoresist 23 by an amount that varies with the distance between the surface of the photoresist and the mask.

The blocked area 36 of mask 32 may contain an opening 38 in the blocking material, shown in FIG. 4, which is utilized to define the reference feature on the photoresist 23 during the first exposure. This reference mark is exemplified by a bar configuration. Focus monitor pattern 46 in mask 42 is formed in relation to the predefined reference mark 38 and is also exemplified as a bar configuration. However, the reference mark and monitor shift mark may be configured in other shapes. The reference mark 38, alternatively, may comprise a feature of the circuit pattern and thus need not be formed under the blocked area during the first exposure.

After both exposures of the photoresist, both the reference mark and the shifted focus monitor mark will be evident. The layout of pattern 46 on mask 42 is constructed so that its shifted mark on the photoresist compares accurately with the reference mark when the photoresist surface is positioned within an acceptable margin of the focus plane.

Figure 6:
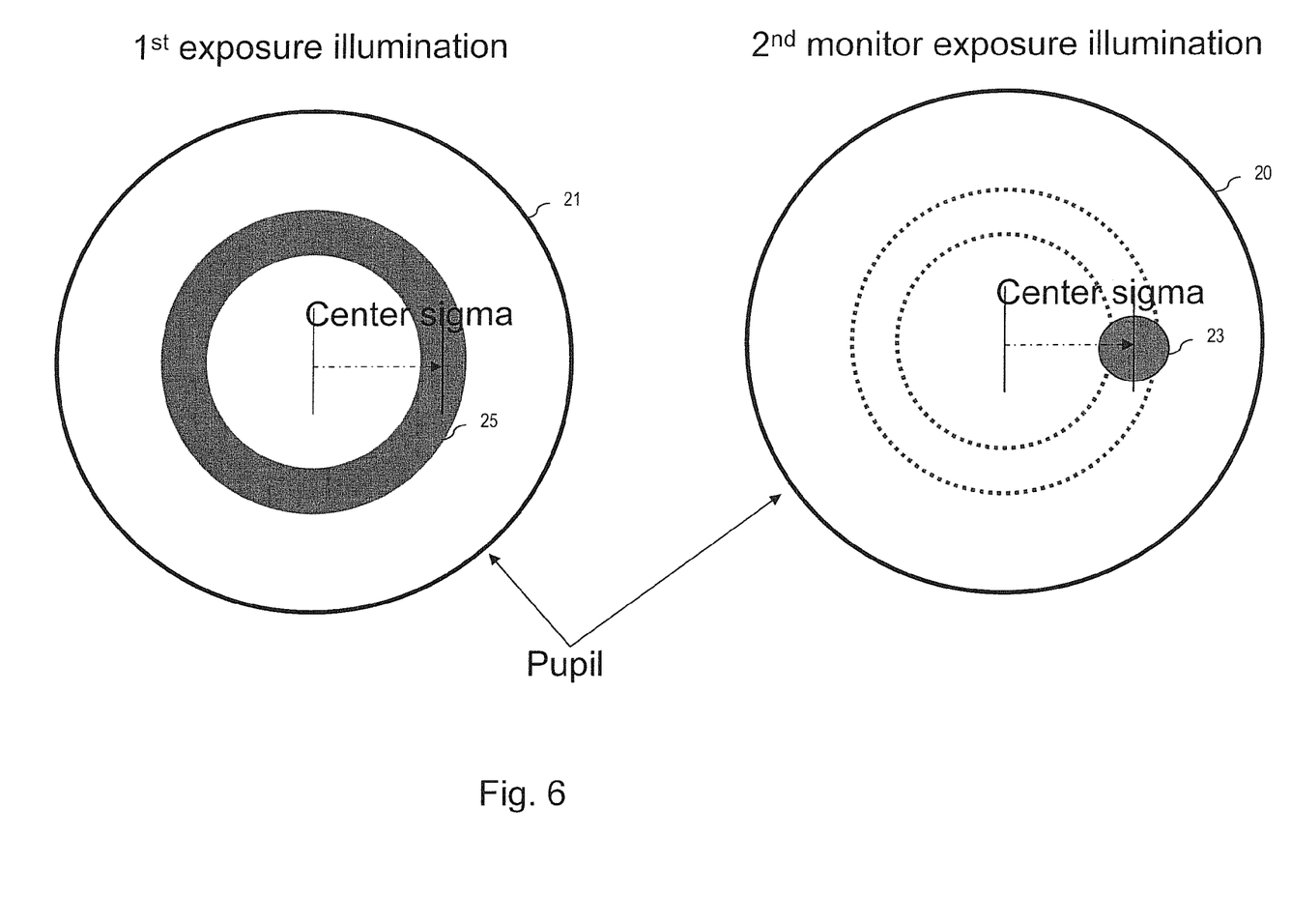
FIG. 6 is an illustration of center sigma relationship for exposures represented in FIG. 3.

As illustrated in FIG. 6, light bean 21 comprises a peripheral pupil 21 generated by light source 25. Light source 25 is exemplified by an annular source, although other balanced sources may be utilized. The radial dimension from the center of pupil 21 to the midpoint of source 25 is defined as the center sigma of the light source 25. Light beam 20 comprises a peripheral pupil 20 generated by monopole light source 23. The radial dimension from the center of pupil 20 to the midpoint of source 23 is defined as the center sigma of the light source 23. In order to quantize the amount of defocus after the first and second exposures, the center sigma of light beam 21 should be matched with the center sigma of light beam 20.

In an alternative embodiment of the monitoring process, both the predefined reference feature and the monitor shift feature may be formed during the second exposure. The blocked area 36, shown in FIG. 3, in this instance, will prevent the entire blocked area of the photoresist from exposure to the balanced light source that is applied first. The focus monitor pattern of mask 42, which is subject to the second exposure, comprises the reference feature as well as the monitor shift feature. The dimensions of these features can be set so that the reference feature will not shift and the monitored feature does shift during exposure to the unbalanced source 20.

Figure 7A:
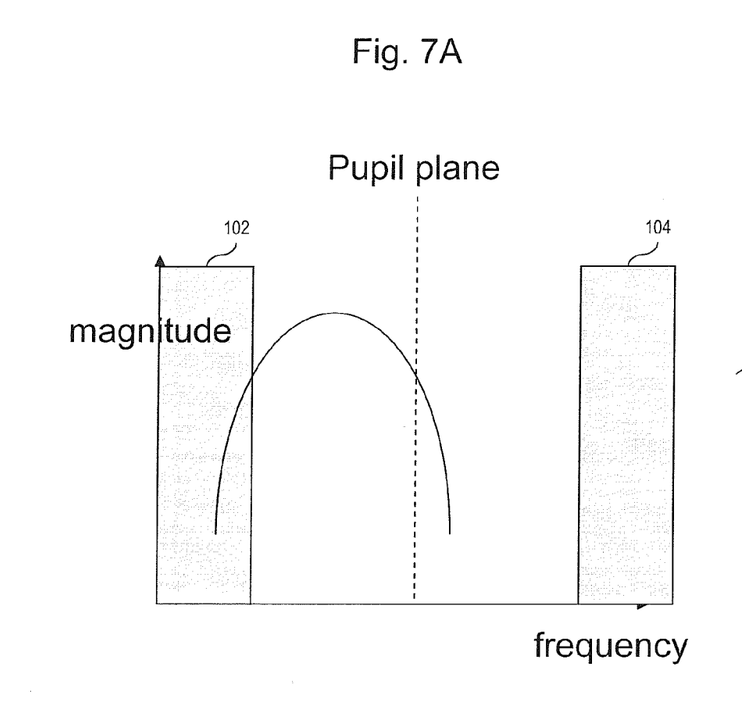
FIGS. 7A and 7B are illustrations of the effects of shifting in dependence on width of feature being exposed.
Figure 7B:
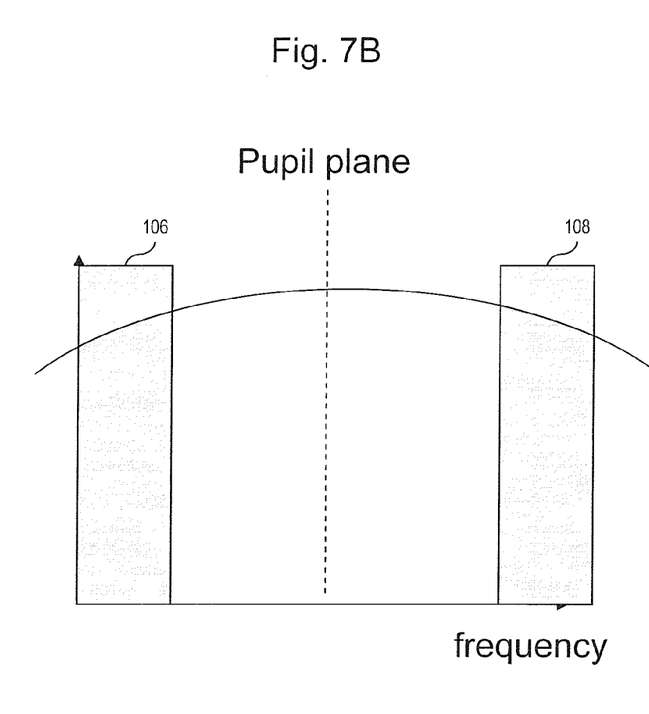

FIGS. 7A and 7B are illustrative of the effects of feature dimension, light magnitude and frequency, on image shift for off-axis illumination. The light pupil acts as a low pass filter which consists of a clear pass region bounded by blocking areas 102 and 104. As a result, the high spatial frequency elements of the mask do not pass the pupil to form an image. In general, the spectra is determined by the Fourier transformation of the mask patterns.

If the isolated feature size on the mask is sufficiently small with respect to the light wavelength (e.g. k1=0.3), the resultant spectrum forms a broad range that fills the pupil, and the image placement error by the defocus becomes minimal because movement of the spectrum is not discernible, as shown in FIG. 7B. However, if the mask pattern is large enough relative to the shifter, the image dislocation becomes larger compared to the reference pattern. The focus monitor pattern thus can be dimensioned with sufficient width to produce an image shift.

The mask exposure area of FIG. 7B is bounded by light blocking elements 106 and 108. The exposure width between elements 102 and 104 is very narrow, with respect to the pupil plane, so that a broad spectrum is generated. Although off-axis illumination generates a spectrum shift, the shift is not large enough to shift the image. A reference pattern thus can be formed in the mask 42 that is dimensioned sufficiently narrow to prevent an image shift.

Figure 8A:
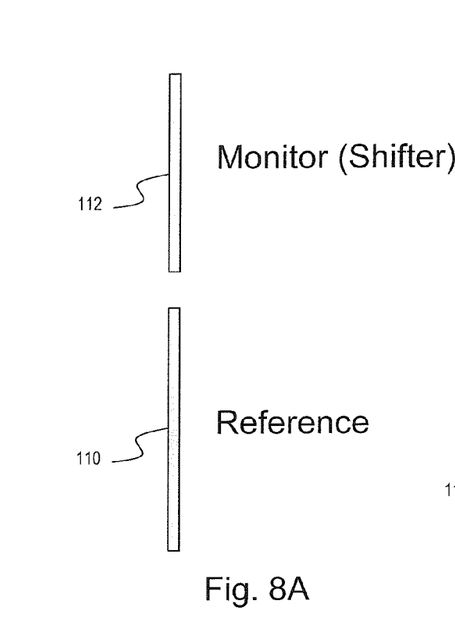
FIGS. 8A and 8B are illustrations of focus monitoring results using bar or trench as reference features.
Figure 8B:
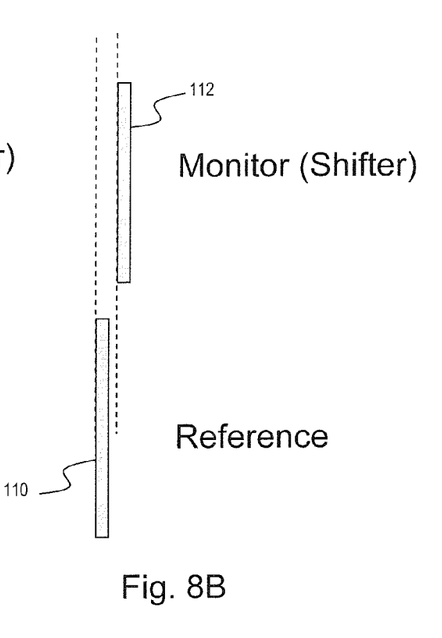

FIGS. 8A and 8B are illustrative of focus monitoring wherein the reference and monitoring features comprise bar configurations. FIG. 8A represents an in focus determination. Reference feature 110 and monitor shift feature 112 on the exposed photoresist 23 are sensed. As described previously, reference feature 110 may be formed during the first exposure, either as a circuit feature or separate reference, or during the second exposure. The monitor shifter feature 112 is formed during the second exposure. The focus monitor pattern of mask 42 is designed to produce a shift of the bar feature so that it will be aligned with the reference bar feature for best focus. Such alignment is illustrated in FIG. 8A. Thus the vertical position of the wafer during exposures is appropriate.

FIG. 8B illustrates an out of focus result, wherein the monitor reference 112 is shifted outside the acceptable margin. This result indicates that the vertical position of wafer during exposure should be changed. The required change can be quantized as the lateral shift is related to vertical position.

Figure 9A:
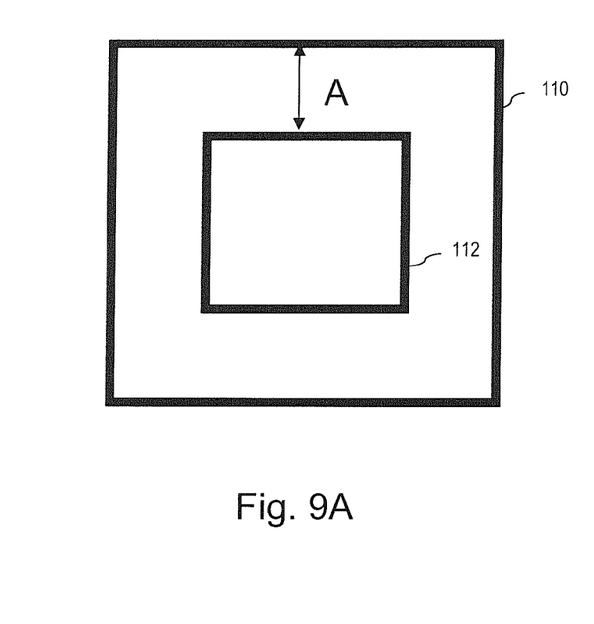
FIGS. 9A and 9B are illustrations of focus monitoring results using box-in-box features.
Figure 9B:
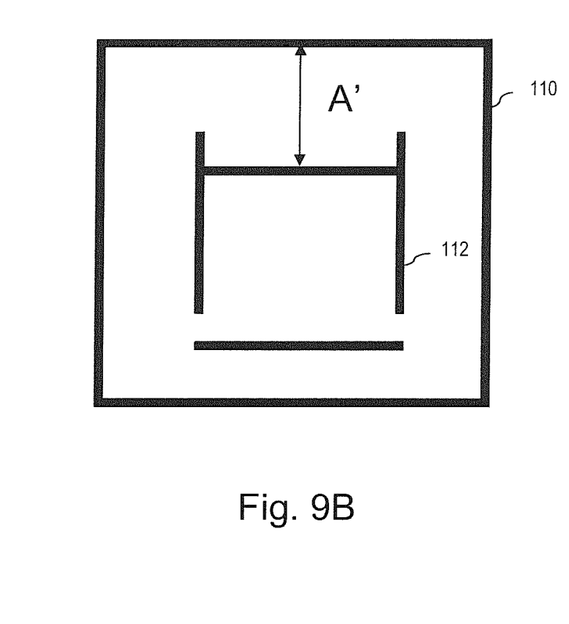

FIGS. 9A and 9B are illustrative of focus monitoring wherein the reference and monitoring features comprise box configurations. FIG. 9A represents an in focus determination. Reference feature 110 and monitor shift feature 112 on the exposed photoresist 23 are sensed. Reference feature 110 may be formed to produce a box outline during the first exposure by exposure to a pattern formed in the blocked area of mask 32. Alternatively, reference feature 110 may be formed during the second exposure from a pattern of sufficiently narrow dimension. The monitor shifter feature 112 is formed during the second exposure. Feature 112 is a box outline that is smaller than box 110. Boxes 110 and 112 both have the same aspect ratios, exemplified as squares. The focus monitor pattern of mask 42 is designed to produce a shift of feature 112 so that the distance between the sides of inner box 112 and the corresponding sides of outer box 110 is a uniform amount "A". If the alignment shown in FIG. 9A is sensed, the vertical position of the wafer during exposures is appropriate.

FIG. 9B illustrates an out of focus result, wherein the monitor reference 112 is shifted outside the acceptable margin. As shown, the distance between the corresponding upper sides of the boxes 110 and 112 is an amount "A'". This result indicates that the vertical position of wafer during exposure should be changed. The required change can be quantized by measuring the difference between dimension A and dimension A'.

In this disclosure there are shown and described only preferred embodiments of the invention and but a few examples of its versatility. It is to be understood that the invention is capable of use in various other combinations and environments and is capable of changes or modifications within the scope of the inventive concept as expressed herein. For example, the concepts of the present disclosure are applicable to various other reference and shift patterns and to exposure to other balanced light sources.

What is claimed is:

1. A method for monitoring focus, the method comprising:
a first step of illuminating a photoresist layer on a substrate with a light beam transmitted through a first mask to define a circuit pattern on the substrate;
a second step of illuminating the photoresist layer with an unbalanced off-axis light beam transmitted through a second mask, the second mask containing a shifting feature configuration;
developing the photoresist layer;
comparing a pattern on the photoresist layer formed by the second illuminating step with a predefined reference feature on the photoresist layer; and
determining whether the substrate position relative to the masks produces appropriate focus on the photoresist layer in response to the comparing step.

2. A method as recited in claim 1, wherein the light beam transmitted in the first step is a balanced off-axis light beam.

3. A method as recited in claim 2, wherein the balanced off-axis light beam is annular illumination.

4. A method as recited in claim 2, wherein the balanced off-axis light beam is dipole illumination.

5. A method as recited in claim 2, wherein the balanced off-axis illumination is C-quad illumination.

6. A method as recited in claim 2, wherein the balanced off-axis illumination is quadrupole illumination.

7. A method as recited in claim 2, wherein the balanced off-axis illumination is quasar illumination.

8. A method as recited in claim 2, wherein the unbalanced off-axis light beam is monopole illumination.

9. A method as recited in claim 8, wherein the center sigma of the balanced off-axis light beam is the same as the center sigma of the monopole illumination.

10. A method as recited in claim 1, wherein the first mask contains a reference portion configured to form the predefined reference feature on the photoresist and the first step of illuminating comprises exposing the photoresist through the first mask reference portion.

11. A method as recited in claim 1, wherein the second mask comprises a portion configured to form the predetermined reference feature as well as the shifting feature configuration.

12. A method as recited in claim 11, wherein the configured portion of the second mask is dimensioned to prevent a lateral shift of the predetermined reference feature.

13. A method as recited in claim 1, wherein the first mask and second mask are binary masks.

14. A method as recited in claim 1, wherein the predetermined reference feature and the shifting feature comprise bar configurations.

15. A method as recited in claim 1, the predetermined reference feature and the shifting feature comprise box configurations.

16. A method as recited in claim 1, wherein the step of comparing comprises determining an amount of shift between the predefined reference feature and the shifting feature on the surface of the photoresist layer.

17. A focus monitoring apparatus comprising:
a first binary mask comprising a pattern to be applied to a photoresist layer by exposure of the photoresist to a balance off-axis light illumination transmitted through the first binary mask; and
a second binary mask comprising an image feature to be applied to the photoresist layer by exposure of the photoresist to an unbalanced off-axis light illumination transmitted through the second binary mask;
wherein development of the photoresist after exposure to illumination through the first binary mask and the second binary mask provides an indication on the photoresist of a shift between an image feature of the pattern and a predetermined reference feature, to determine whether the photoresist position relative to the masks produces appropriate focus on the photoresist.

18. A focus monitoring apparatus as recited in claim 17, wherein the center sigma of the balanced off-axis light illumination is the same as the center sigma of the unbalance off-axis light illumination.

19. A focus monitoring apparatus as recited in claim 17, wherein the pattern of the first binary mask comprises a portion defining a circuit pattern on a substrate underlying the photoresist layer and a portion defining the reference feature.

20. A focus monitoring apparatus as recited in claim 19, wherein the predetermined reference feature comprises a chip design feature.

21. A focus monitoring apparatus as recited in claim 17, wherein the second binary mask comprises a pattern for defining the reference feature.

* * * * *

UNITED STATES PATENT AND TRADEMARK OFFICE
CERTIFICATE OF CORRECTION

PATENT NO. : 8,009,274 B2
APPLICATION NO. : 12/167808
DATED : August 30, 2011
INVENTOR(S) : Ryoung-han Kim Page 1 of 1

It is certified that error appears in the above-identified patent and that said Letters Patent is hereby corrected as shown below:

Title Page, item (73) Assignee should read as follows: GLOBALFOUNDRIES INC.

Signed and Sealed this
First Day of January, 2013

David J. Kappos
*Director of the United States Patent and Trademark Office*